(12) United States Patent
Luong et al.

(10) Patent No.: US 9,899,219 B2
(45) Date of Patent: Feb. 20, 2018

(54) TRIMMING INORGANIC RESISTS WITH SELECTED ETCHANT GAS MIXTURE AND MODULATION OF OPERATING VARIABLES

(71) Applicant: Tokyo Electron Limited, Minato-ku, Tokyo (JP)

(72) Inventors: Vinh Luong, Guilderland, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/232,330

(22) Filed: Aug. 9, 2016

(65) Prior Publication Data

US 2017/0243744 A1 Aug. 24, 2017

Related U.S. Application Data

(60) Provisional application No. 62/297,709, filed on Feb. 19, 2016.

(51) Int. Cl.
| | | |
|---|---|---|
| *H01L 21/033* | (2006.01) | |
| *H01L 21/311* | (2006.01) | |
| *H01L 21/683* | (2006.01) | |
| *H01L 21/66* | (2006.01) | |
| *H01L 21/67* | (2006.01) | |

(52) U.S. Cl.
CPC .... *H01L 21/0337* (2013.01); *H01L 21/31122* (2013.01); *H01L 21/6831* (2013.01); *H01L 22/26* (2013.01); *H01L 21/67017* (2013.01); *H01L 21/67109* (2013.01)

(58) Field of Classification Search
CPC ................. H01L 21/0337; H01L 22/26; H01L 21/31122; H01L 21/6831
See application file for complete search history.

(56) References Cited

U.S. PATENT DOCUMENTS

| | | |
|---|---|---|
| 4,750,980 A | 6/1988 | Hynecek |
| 4,878,993 A | 11/1989 | Rossi et al. |
| 5,286,337 A | 2/1994 | Tsou |
| 6,036,876 A | 3/2000 | Chen et al. |
| 6,623,653 B2 | 9/2003 | Furuta et al. |
| 2008/0061030 A1 | 3/2008 | Liu et al. |
| 2015/0072530 A1* | 3/2015 | Kim .................... H01L 21/3065 438/703 |

\* cited by examiner

*Primary Examiner* — Kyoung Lee
(74) *Attorney, Agent, or Firm* — Wood Herron & Evans LLP

(57) ABSTRACT

Provided is a method of trimming an inorganic resist in an integration scheme, the method comprising: disposing a substrate in a process chamber, the substrate having an inorganic resist layer and an underlying layer comprising an oxide layer, a silicon nitride layer, and a base layer, the inorganic resist layer having an inorganic structure pattern; performing an inorganic resist trimming process to selectively remove a portion of the inorganic resist structure pattern on the substrate, the trimming process using a first etchant gas mixture and generating a first pattern; controlling selected two or more operating variables of the integration scheme in order to achieve target integration objectives; wherein the first etchant gas mixture comprises a fluorine-containing gas and a diluent gas; and wherein the target integration objectives include a target critical dimension (CD), a target line edge roughness (LER), a target line width roughness (LWR) and a target substrate throughput.

20 Claims, 19 Drawing Sheets

TRIMMING INORGANIC RESISTS WITH SELECTED ETCHANT GAS MIXTURE AND MODULATION OF OPERATING VARIABLES

BACKGROUND OF THE INVENTION

Field of Invention

The invention relates to a method for trimming inorganic resists and specifically to etching layers with enhanced etch sensitivity of etchant gas mixtures resulting in improved critical dimension trim rate by using selected etchant gas mixtures and modulation of operating variables.

Description of Related Art

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Photolithography is a standard technique used to manufacture semiconductor integrated circuitry by transferring geometric shapes and patterns on a mask to the surface of a semiconductor wafer. However, current state-of-the-art photolithography tools allow minimum feature sizes down to about 25 nm. Accordingly, new methods are needed to provide smaller features.

The semiconductor industry is adopting extreme ultra violet (EUV) light for structures 7 nm and smaller. A lot has been done by some companies on EUV equipment to improve the source power and equipment reliability. However, not a lot of work has been done to address the fundamental issue of shot noise on the material area. Shot noise describes the fluctuations of photons directed to an area due to their occurrence independent of each other. In this case, shot noise is a statistical probability of underexposing a pixel in the structure area. In terms of semiconductor lithography and etching, not enough photons are delivered and captured into the current resist being used in EUV processes. This effect of shot noise is higher line width roughness (LWR) and line edge roughness (LER) issues. Some new inorganic resists that are able to capture more photons than the current organic resists recently became available for use with EUV photolithography.

There is a need to test and develop inorganic resists for high volume manufacturing in order to become useful. Furthermore, there is also a need to ascertain the combination of gases and relative flowrates or ratios of etchant gases to each other that provide the etch sensitivity required while maintaining or improving the other metrics of the integration scheme. Overall, there is a need for controlled etching techniques, processes, etchant gas combinations, and ratios of etchant gases that produce acceptable etch selectivity, critical dimension (CD), LER, and LWR results that enable achieving integration objectives when processing smaller feature patterns that are feasible using inorganic resists.

SUMMARY OF THE INVENTION

Provided is a method of trimming an inorganic resist in an integration scheme, the method comprising: disposing a substrate in a process chamber, the substrate having an inorganic resist layer and an underlying layer comprising an oxide layer, a silicon nitride layer, and a base layer, the inorganic resist layer having an inorganic structure pattern; performing an inorganic resist trimming process to selectively remove a portion of the inorganic resist structure pattern on the substrate, the trimming process using a first etchant gas mixture and generating a first pattern; and controlling selected two or more operating variables of the integration scheme in order to achieve target integration objectives; wherein the first etchant gas mixture comprises a fluorine-containing gas and a diluent gas; and wherein the target integration objectives include a target critical dimension (CD), a target line edge roughness (LER), a target line width roughness (LWR) and a target substrate throughput.

Also provided is a method of trimming an inorganic resist in an integration scheme, the method comprising: disposing a substrate in a process chamber, the substrate having an inorganic resist layer and an underlying layer, the underlying layer comprising a carbon layer, an oxide layer, a silicon nitride layer, and a base layer, the inorganic resist layer having an inorganic resist structure pattern; performing an inorganic resist trimming process to selectively remove a portion of the inorganic resist structure pattern on the substrate, the trimming process using a first etchant gas mixture and generating a first pattern; performing an oxide etch process using a second etchant gas mixture and generating a second pattern; performing a breakthrough etch process using a third etchant gas mixture and generating a third pattern; performing a titanium nitride etch process using a fourth etchant gas mixture and generating a last pattern; and controlling selected two or more operating variables of the integration scheme in order to achieve target integration objectives; wherein the first etchant gas mixture is a fluorine-containing gas and a diluent gas; wherein the target integration objectives include a target critical dimension (CD), a target line edge roughness (LER), a target line width roughness (LWR), and a target substrate throughput; and wherein the inorganic resist structure pattern can be a line and space pattern or a contact hole pattern.

BRIEF DESCRIPTION OF THE DRAWINGS

In the accompanying drawings:

FIG. 7A depicts a cross-sectional image after a trimming process of the resist pattern and where trimming was done for 5 seconds whereas FIG. 7B depicts a cross-sectional image after a trimming process of the resist pattern and where trimming was done for 7 seconds whereas

FIG. 10A depicts a slanted-view of the input resist pattern in a substrate whereas

DETAILED DESCRIPTION OF SEVERAL EMBODIMENTS

In the following description, for purposes of explanation and not limitation, specific details are set forth, such as a particular geometry of a processing system, descriptions of various components, and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
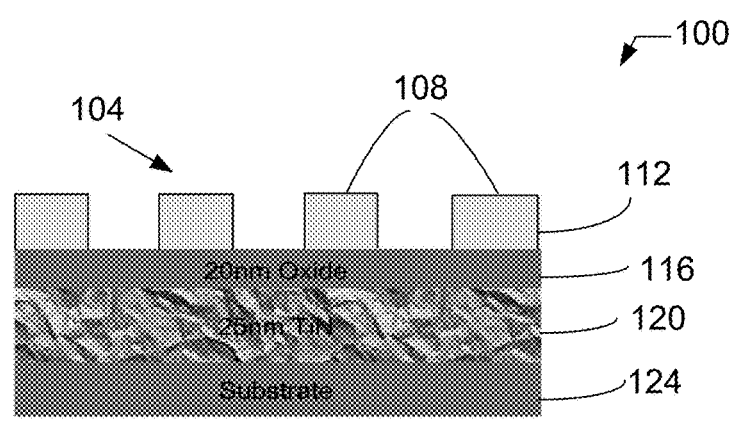
FIG. 1A depicts a schematic of an input substrate with an inorganic resist input pattern.

Referring now to the drawings, wherein like reference numerals designate identical or corresponding parts throughout the several views, FIG. 1A depicts a schematic 100 of an input substrate 104 with an inorganic resist pattern 108. The underlying layer comprises an oxide layer 116, a titanium nitride layer 120, and a base layer 124, where the inorganic resist layer 112 has an inorganic resist pattern 108. The oxide layer 116 can be silicon oxide, thermal oxide, chemical vapor deposition (CVD) oxide, tetra-ethyl-ortho-silane (TEOL), and the like. As mentioned above, organic resists are undergoing difficulties in achieving the desired CD in the range of 7 nm or less 12 nm or less.

Figure 1B:
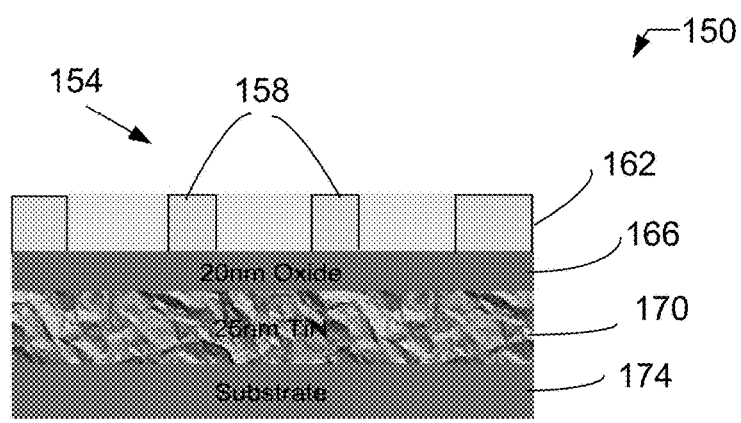
FIG. 1B depicts a schematic of the substrate after a trimming process in an embodiment of the present invention.

FIG. 1B depicts a schematic 150 of the substrate 154 after a trimming process in an embodiment of the present invention. As above, the underlying layer comprises an oxide layer 166, a titanium nitride layer 170, and a base layer 174, where the inorganic resist layer 162 has an inorganic resist pattern 158. The inorganic resist pattern 158 in FIG. 1B is slimmer compared to the inorganic resist pattern 158 in FIG. 1A due to the trimming process which shall be discussed in detail below.

Figure 2A:
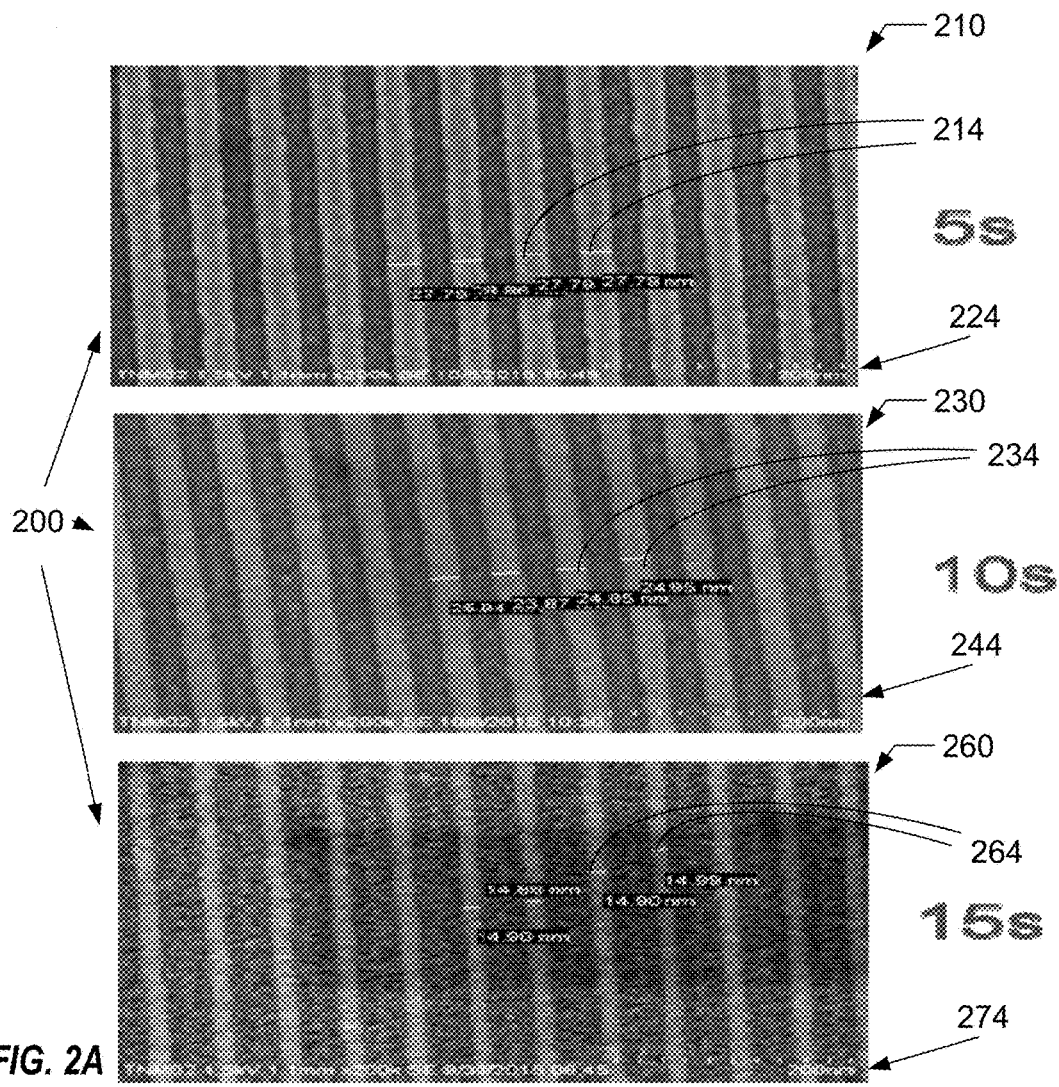
FIG. 2A depicts top-view images of a substrate in various time ranges of exposure time to the selected etchant gas mixture in an embodiment of the present invention.

FIG. 2A depicts top-view images 200 of a substrate in various ranges of exposure time to the selected etchant gas mixture in an embodiment of the present invention. The first top-view image 210 highlights the inorganic resist pattern 214 of the substrate after a trimming process of 5 seconds, using an etchant gas mixture comprising $CH_3F$ and Ar. The chemical reactions involved are:

The second top-view image 230 highlights the inorganic resist pattern 234 of the substrate after a trimming process of 10 seconds, again using an etchant gas mixture comprising $CH_3F$ and Ar. The third top-view image 260 highlights the inorganic resist pattern 264 of the substrate after a trimming process of 15 seconds, using an etchant gas mixture comprising $CH_3F$ and Ar.

Figure 2B:
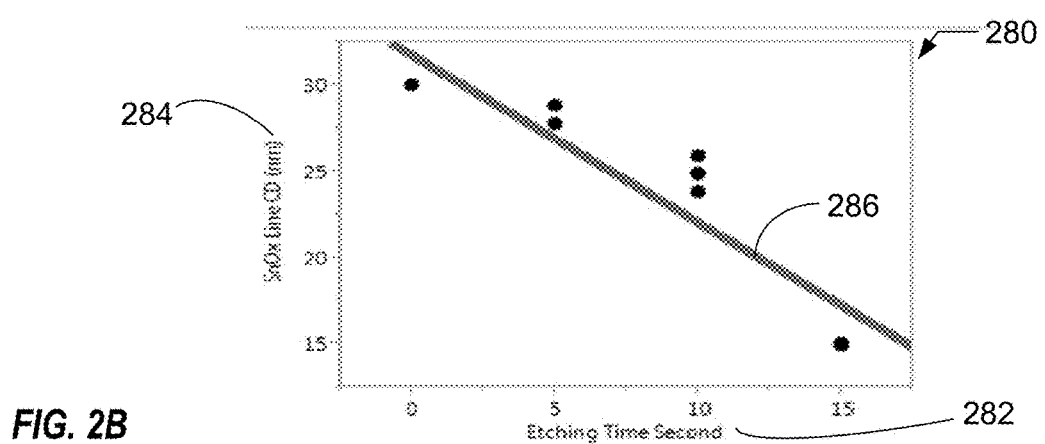
FIG. 2B depicts a graph of the line critical dimension (CD) as a function of the length of etching time, according to an embodiment of the present invention.

FIG. 2B depicts a graph 280 of the line critical dimension (CD) as a function of the length of etching time, according to an embodiment of the present invention. The X-axis 280 is the etching (trimming) time in seconds and the Y-axis 284 is the inorganic resist pattern line CD in nm. The curve 286 is based on bivariate linear fit of the X and Y-axis variables data.

Figure 3A:
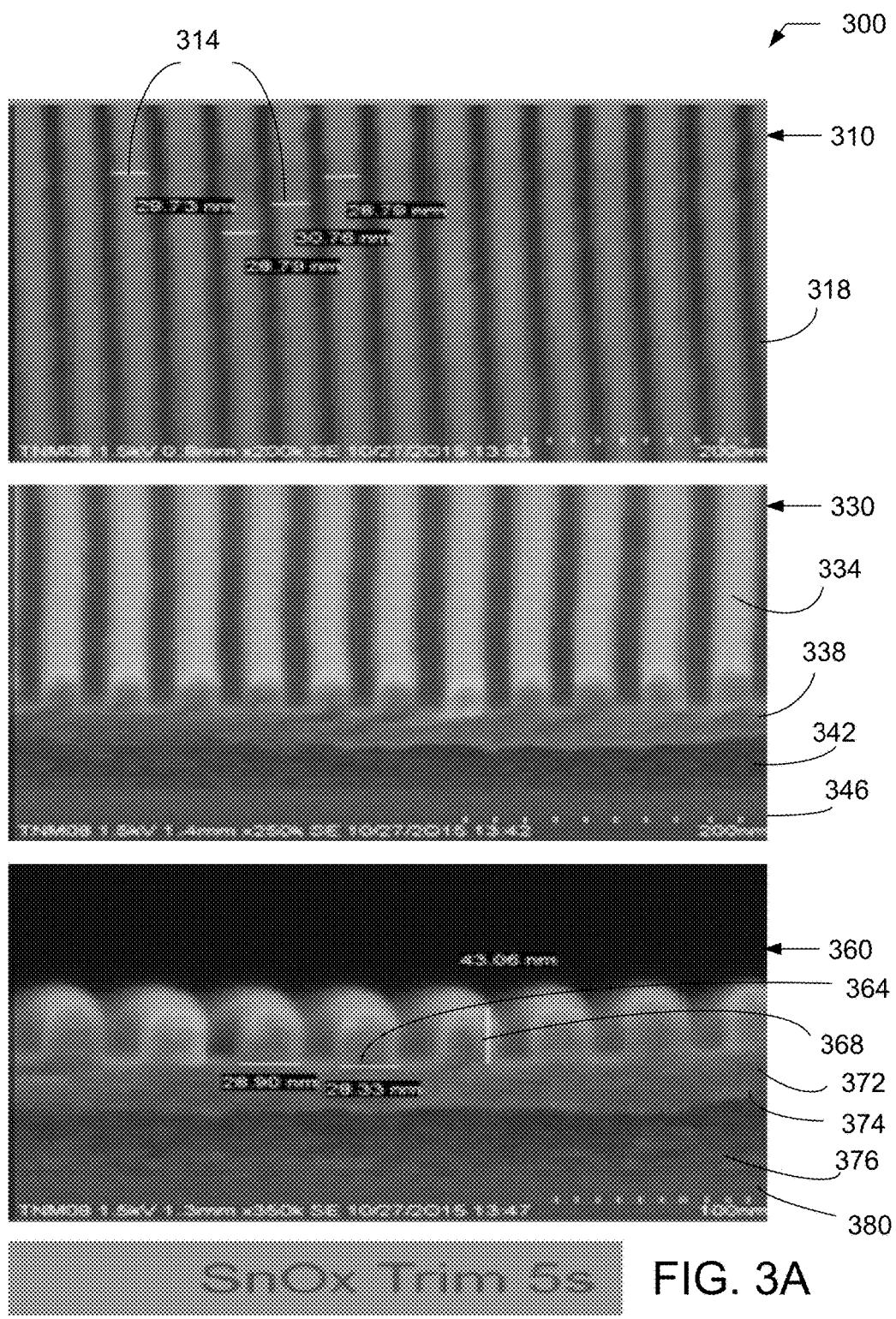
FIG. 3A depicts a top-view image of an input substrate, a slanted-view image after a 5 second exposure to the etchant gas mixture, and a cross-sectional view image of the structure after a 5 second exposure to the etchant gas mixture.

FIG. 3A depicts images 300 of different views of a substrate including a top-view image 310, a slanted-view image 330, and a cross-sectional view image 360 of the structure after a 5 second exposure to the trim etchant gas mixture according to an embodiment of the present invention. The top-view image 310 depicts the line and space 318 and critical dimensions 314 after the trimming process. The slanted-view image 330 depicts the structure pattern 334, the oxide layer 338, the titanium nitride layer 342, and the base layer 346 after a 5 second exposure to the trim etchant gas mixture. The cross-sectional view image 330 shows the line and space pattern 372, the CD 364, the structure height 368, the oxide layer 374, the titanium nitride layer 376, and the base layer 380 after a 5 second exposure to the trim etchant gas mixture.

Figure 3B:
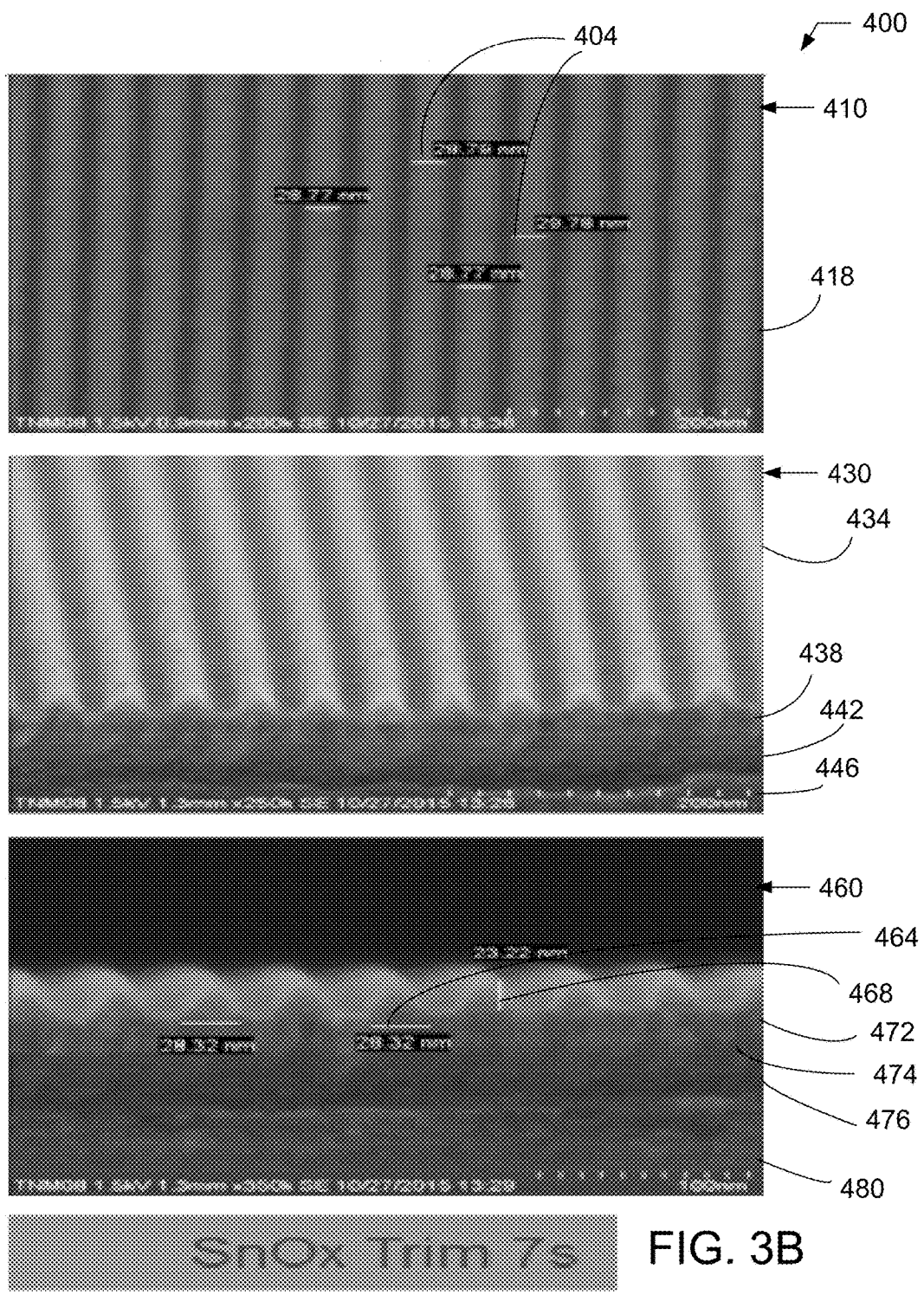
FIG. 3B depicts a top-view image of an input substrate, a slanted-view image after a 7 second exposure to the etchant gas mixture, and a cross-sectional view image of the structure after a 7 second exposure to the etchant gas mixture.

FIG. 3B depicts images 400 of different views of a substrate including a top-view image 410, a slanted-view image 430, and a cross-sectional view image 460 of the structure after a 7 second exposure to the trim etchant gas mixture according to an embodiment of the present invention. The top-view image 410 depicts the line and space 418 and critical dimension 404 after the trimming process. The slanted-view image 430 depicts the structure pattern 434, the oxide layer 438, the titanium nitride layer 442, and the base layer 446 after a 7 second exposure to the trim etchant gas mixture. The cross-sectional view image 460 shows the line and space pattern 472, the CD 464, the structure height 468, the oxide layer 474, the titanium nitride layer 476, and the base layer 480 after a 7 second exposure to the trim etchant gas mixture.

Figure 3C:
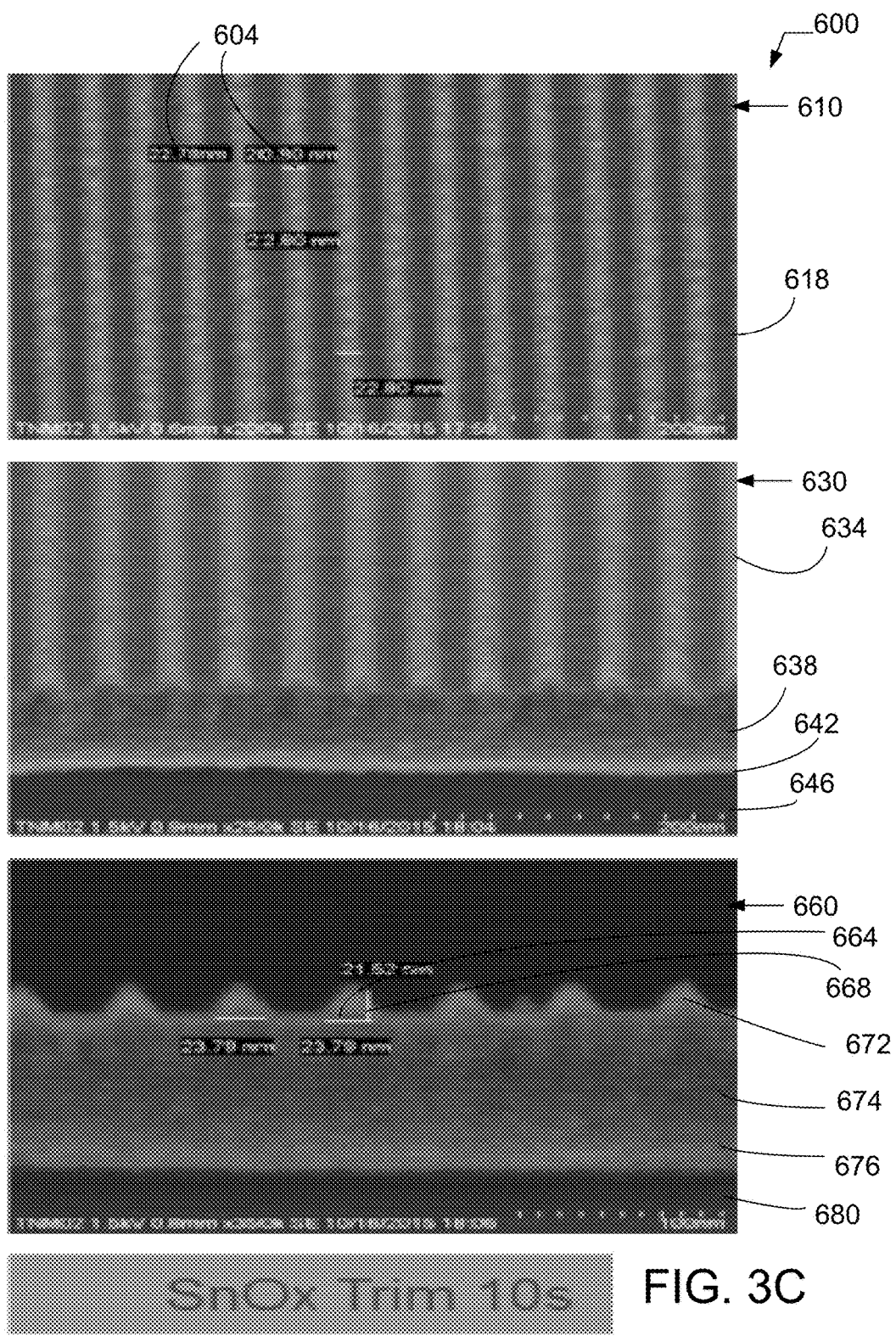
FIG. 3C depicts a top-view image of an input substrate, a slanted-view image after a 10 second exposure to the etchant gas mixture, and a cross-sectional view image of the structure after a 10 second exposure to the etchant gas mixture.

FIG. 3C depicts images 600 of different views of a substrate including a top-view image 610, a slanted-view image 630, and a cross-sectional view image 660 of the structure after a 10 second exposure to the trim etchant gas mixture according to an embodiment of the present invention. The top-view image 610 depicts the line and space 618 and critical dimension 604 after the trimming process. The slanted-view image 630 depicts the structure pattern 634, the oxide layer 638, the titanium nitride layer 642, and the base layer 646 after a 10 second exposure to the trim etchant gas mixture. The cross-sectional view image 660 shows the line and space pattern 672, the CD 664, the structure height 668, the oxide layer 674, the titanium nitride layer 676, and the base layer 680 after a 10 second exposure to the trim etchant gas mixture.

Figure 3D:
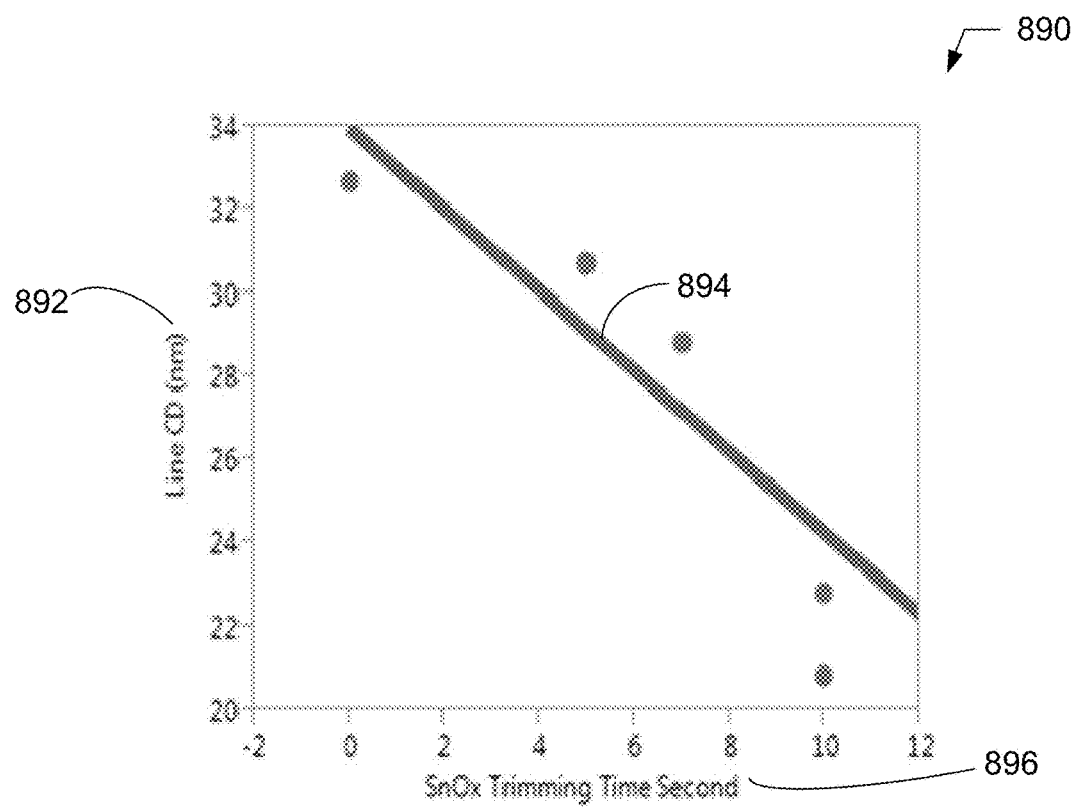
FIG. 3D depicts a graph of the line critical dimension (CD) as a function of the length of etching time, according to an embodiment of the present invention.

FIG. 3D depicts a graph 890 of the line CD as a function of the length of trimming time, according to an embodiment of the present invention. The X-axis 896 is the trimming time in seconds and the Y-axis 892 is the inorganic resist pattern line CD in nm. The curve 894 is based on bivariate linear fit of the X and Y-axis variables data.

Figure 4A:
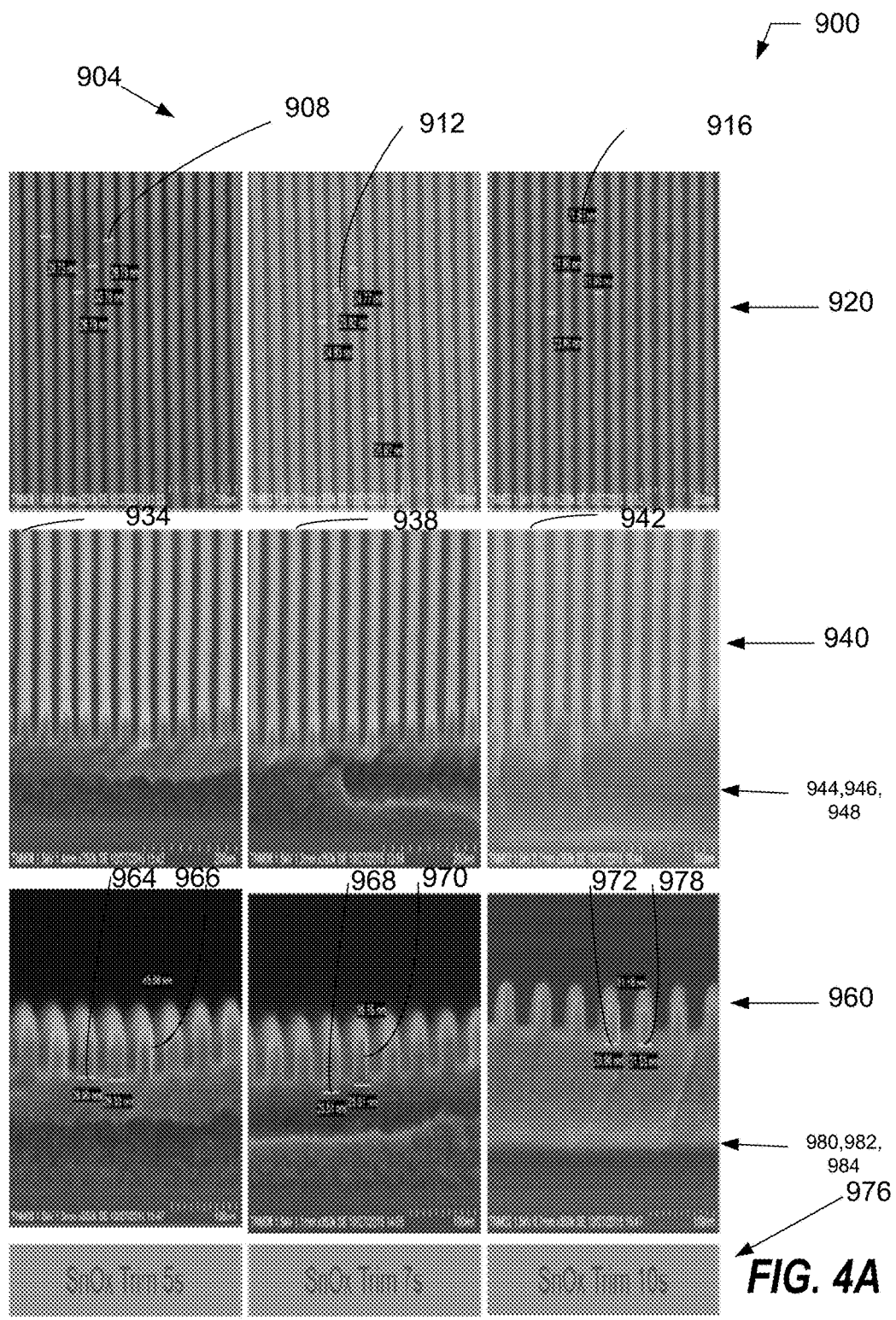
FIG. 4A depicts top-view images, slanted-view images, and cross-sectional view images of a pattern in a substrate using various lengths of processing times according to embodiments of the present invention.

FIG. 4A depicts images 900 of different views of a substrate including top-view images 920, slanted-view images 940, and cross-sectional view images 960 of the structure after a 5, 7, and 10 second exposures to the trim etchant gas mixture according to an embodiment of the present invention. The top-view image 920 depicts the line and space CDs 908, 912, and 916 before the trimming process. The slanted-view image 940 depicts the structure pattern 934, 938, 942 after the trimming process and the underlying layers 944, 946, and 948 respectively of the substrates exposed for 5, 7, and 10 seconds (label 976) to the etchant gas mixture. The cross-sectional view images 960 show the line and space pattern CD and height 964, 966 of the substrate treated for 5 seconds; line and space pattern CD and height 968, 970 of the substrate treated for 7 seconds; and line and space pattern CD and height 972, 978 of the substrate treated for 10 seconds. The cross-sectional view images 960 also show the underlying layers of 980, 982, 984 of the substrates exposed for 5, 7, and 10 seconds (label 976) to the etchant gas mixture after the oxide etch and the titanium nitride etch processes.

Figure 4B:
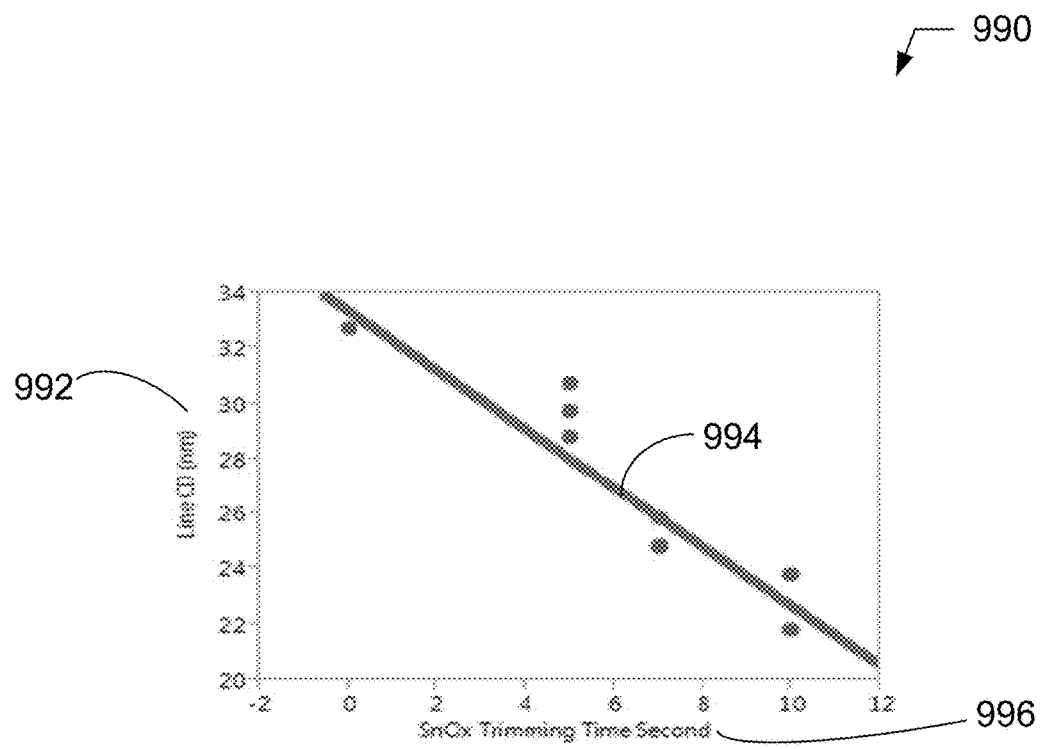
FIG. 4B depicts a graph of the line CD as a function of the length of etching time, according to a further embodiment of the present invention.

FIG. 4B depicts a graph 990 of the line CD as a function of the length of trimming time, according to an embodiment of the present invention. The X-axis 996 is the trimming time in seconds and the Y-axis 992 is the inorganic resist pattern line CD in nm. The curve 894 is based on bivariate linear fit of the X and Y-axis variables data for the process described in relation to FIG. 4A.

Figure 5A:
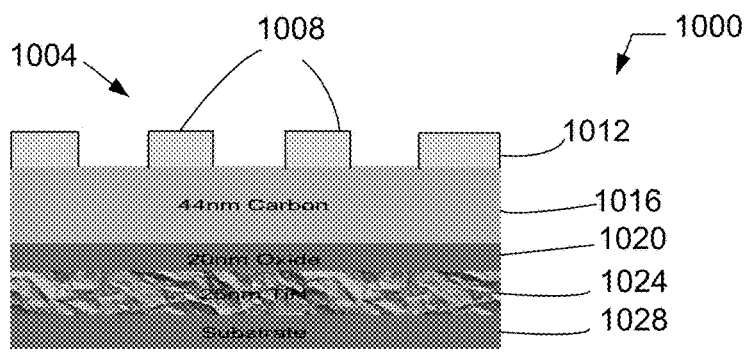
FIG. 5A depicts a schematic of an input substrate with an inorganic resist pattern with an underlying layer comprising a carbon layer, an oxide layer, a titanium nitride layer, and a base layer.

FIG. 5A depicts a schematic 1000 of an input substrate with an inorganic resist pattern 1012 in an embodiment of the present invention, with an underlying layer comprising a carbon layer 1016, an oxide layer 1020, a titanium nitride layer 1024, and a base layer 1028. The carbon layer 1016 can comprise an organic-containing film, an advance hardmask, an amorphous carbon, a diamond-like carbon, an organic planarizing layer, or a photo resist.

Figure 5B:
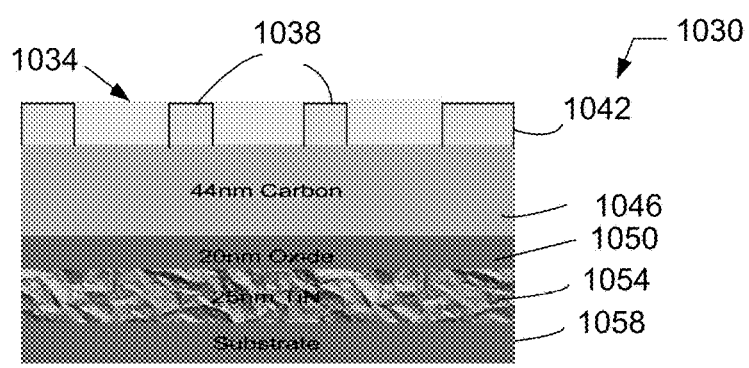
FIG. 5B depicts a schematic of the substrate after a trimming process of the resist pattern.

FIG. 5B depicts a schematic 1030 of the substrate 1034 after a trimming process of the resist pattern 1042, with an underlying layer comprising a carbon layer 1046, an oxide layer 1050, a titanium nitride layer 1054, and a base layer 1058.

Figure 5C:
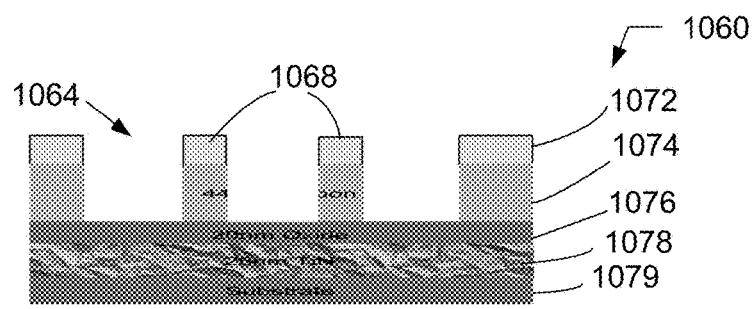
FIG. 5C depicts a schematic of the substrate after a carbon etch process.

FIG. 5C depicts a schematic 1060 of the substrate 1064 after a carbon etch process, with the structure pattern comprising an inorganic resist layer 1072 and carbon layer 1074, and an underlying layer comprising an oxide layer 1076, a titanium nitride layer 1078, and a base layer 1079. The base layer 1079 can comprise amorphous silicon, silicon, titanium nitride, tungsten, tungsten silicon, silicon oxide, silicon nitride, polysilicon, p-doped silicon, n-doped silicon, carbon and the like.

Figure 5D:
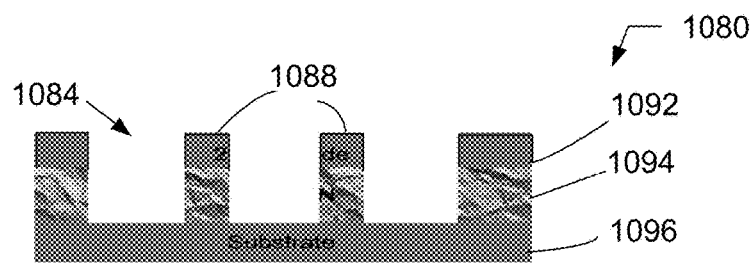
FIG. 5D depicts the substrate after an oxide and titanium nitride etch process in an embodiment of the present invention.

FIG. 5D depicts a schematic 1080 of the substrate 1084 after an oxide and titanium nitride etch process in an embodiment of the present invention, the structure pattern comprising an oxide layer 1092 and a titanium nitride layer 1094 and a base layer 1096.

Figure 6A:
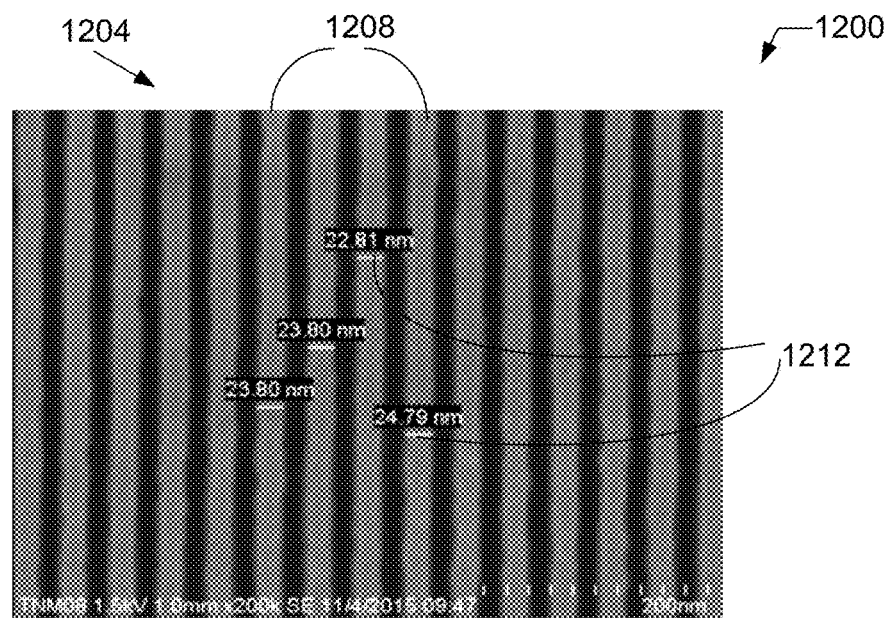
FIG. 6A depicts a schematic of an input substrate with an inorganic resist pattern with an underlying layer comprising a carbon layer, an oxide layer, a titanium nitride layer, and a base layer and where trimming was not done.

FIG. 6A depicts a top view image 1200 of an input substrate 1204 with an inorganic resist pattern 1208 where trimming was not yet done. The inorganic resist pattern 1208 shows the beginning CDs 1212 of several lines.

Figure 6B:
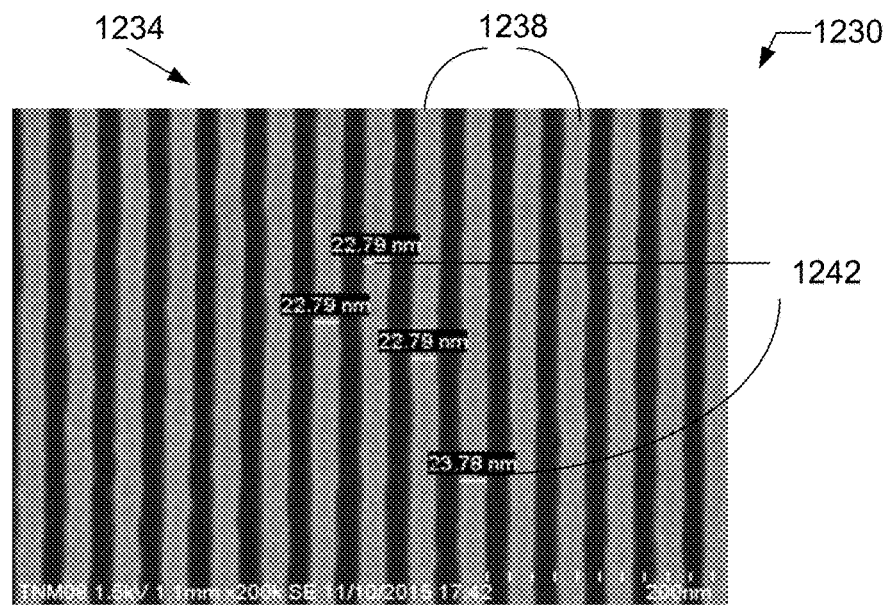
FIG. 6B depicts a schematic of the substrate after a trimming process of the resist pattern and where trimming was done for 5 seconds.

FIG. 6B depicts an image 1230 of the substrate 1234 after a trimming process of the inorganic resist pattern 1238 and where trimming was done for 5 seconds exposure to the etchant gas mixture. The inorganic resist pattern 1238 shows the CDs 1242 of several lines as a result of the trimming process.

Figure 6C:
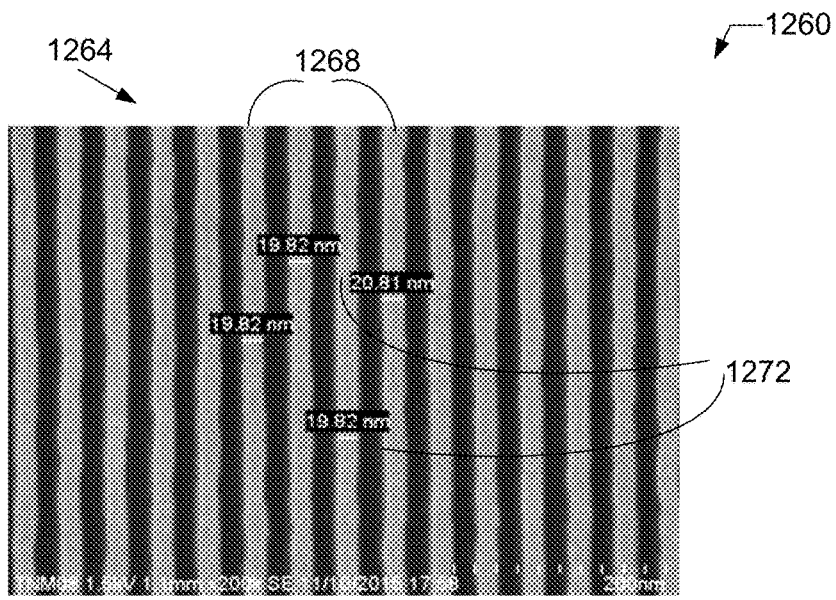
FIG. 6C depicts a schematic of the pattern after a trimming process of the resist pattern and where trimming was done for 7 seconds.

FIG. 6C depicts an image 1260 of the pattern after a trimming process of the inorganic resist pattern 1268 and where trimming was done for 7 seconds exposure to the etchant gas mixture. The inorganic resist pattern 1268 shows the CDs 1272 of several lines as a result of the trimming process where the trim caused a reduction of the CD compared to the 5 second exposure.

Figure 6D:
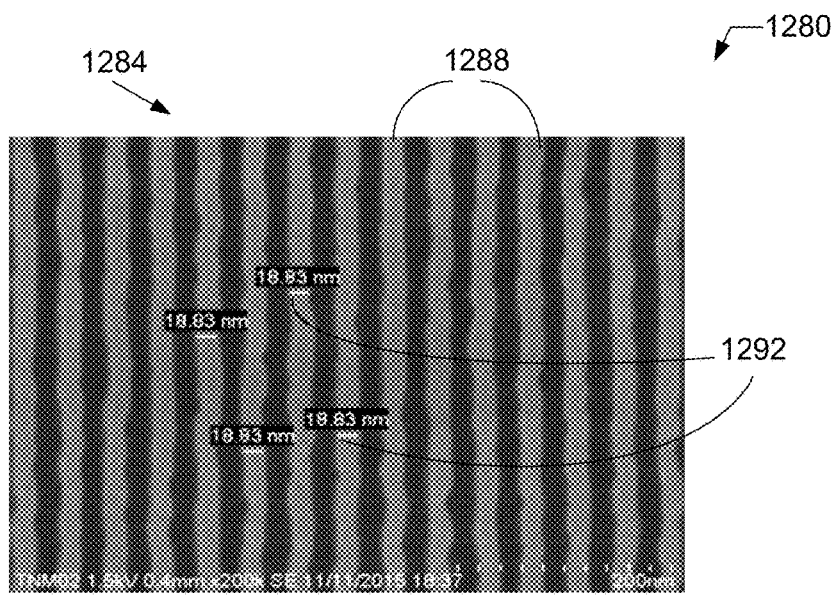
FIG. 6D depicts a schematic of the pattern after a trimming process of the resist pattern and where trimming was done for 10 seconds in another embodiment of the present invention.

FIG. 6D depicts an image 1280 of the substrate after a trimming process of the inorganic resist pattern and where trimming was done for 10 seconds to the etchant gas mixture. The inorganic resist pattern 1288 shows the CDs 1292 of several lines as a result of the trimming process where the trim caused a reduction of the CD compared to the 7 second exposure.

Figure 7A:
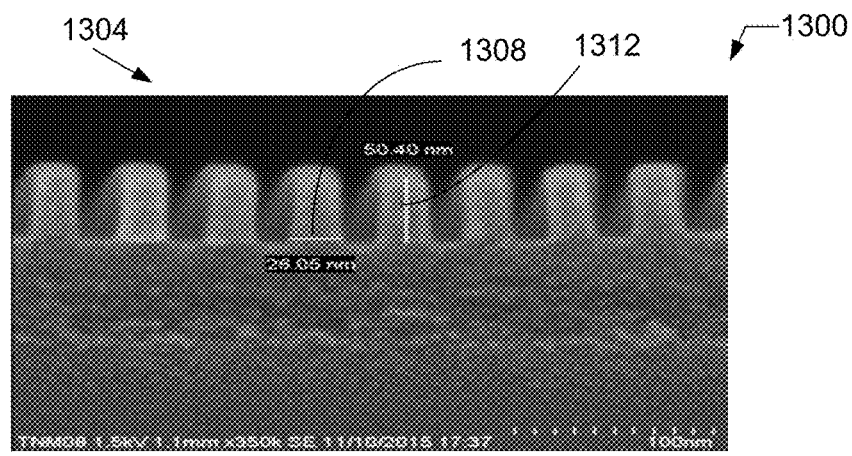

FIG. 7A depicts a cross-sectional image 1300 after a trimming process of the inorganic resist pattern and where trimming was done for 5 seconds. The CD 1308 and height 1312 of the inorganic resist pattern are displayed.

Figure 7B:
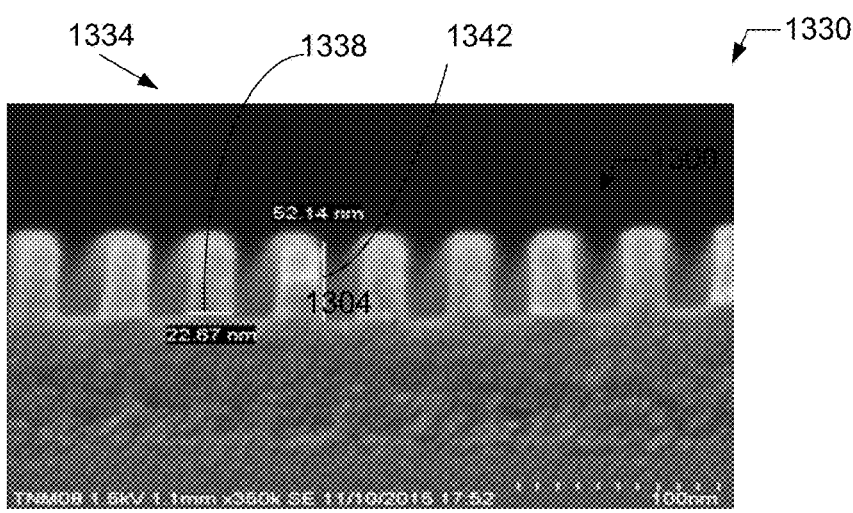

FIG. 7B depicts a cross-sectional image 1330 after a trimming process of the inorganic resist pattern and where trimming was done for 7 seconds. The CD 1338 and height 1342 of the inorganic resist pattern are displayed.

Figure 7C:
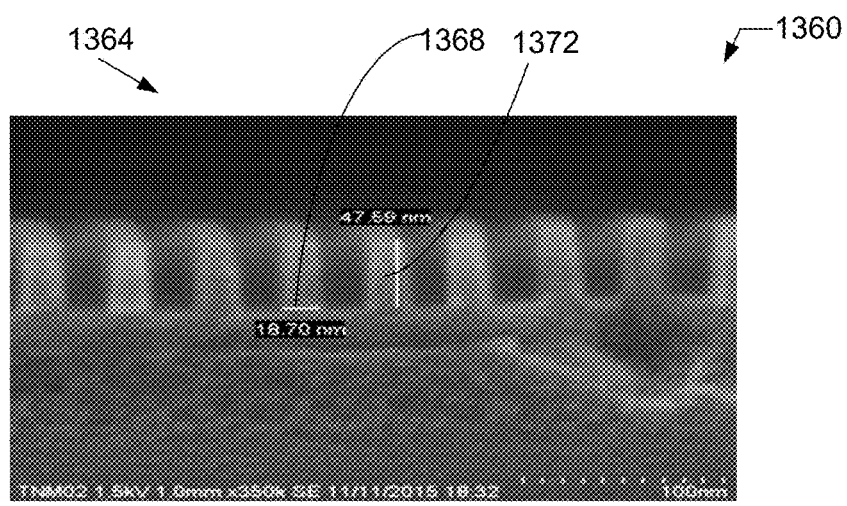
FIG. 7C depicts a cross-sectional image after a trimming process of the resist pattern and where trimming was done for 10 seconds.

FIG. 7C depicts a cross-sectional image 1360 after a trimming process of the inorganic resist pattern and where trimming was done for 10 seconds. The CD 1368 and height 1372 of the inorganic resist pattern are displayed.

Figure 8:
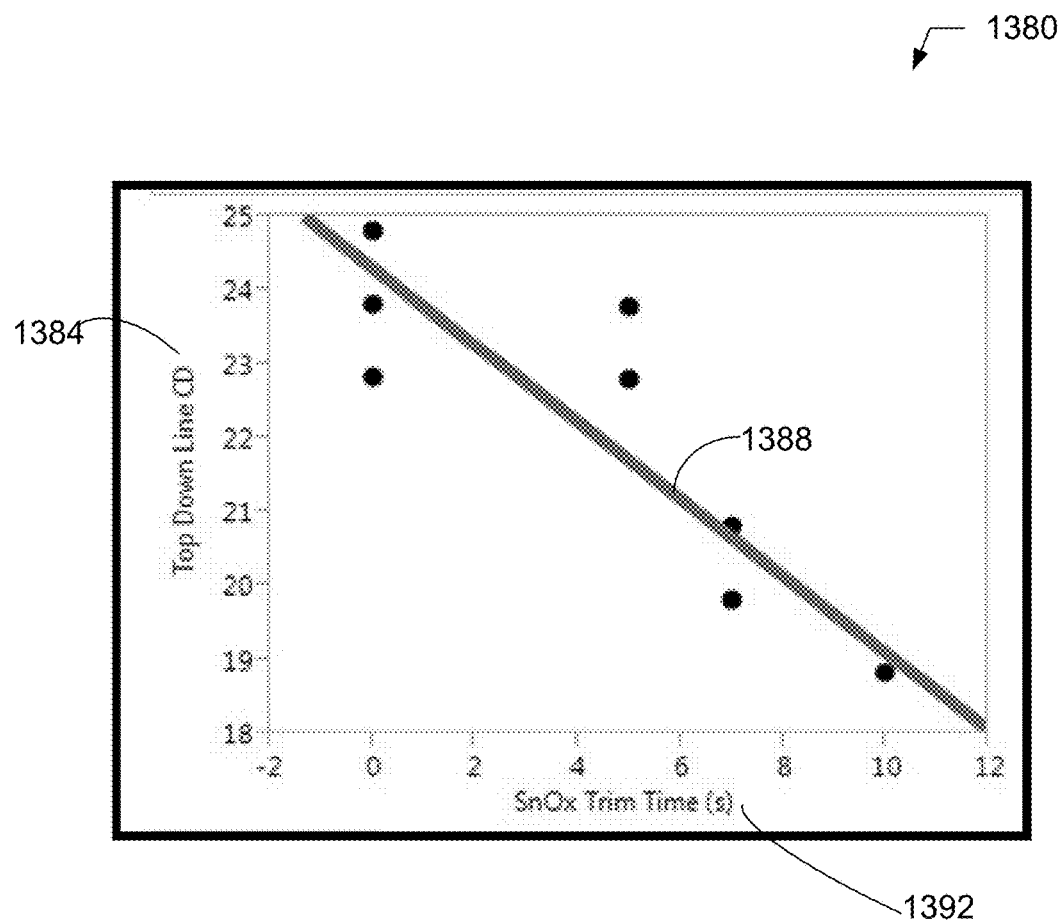
FIG. 8 depicts a graph of the top down line critical dimension (CD) as a function of the length of etching time, according to an embodiment of the present invention.

FIG. 8 depicts a graph 1380 of the line CD as a function of the length of trimming time, according to an embodiment of the present invention. The X-axis 1392 is the trimming time in seconds and the Y-axis 1384 is the inorganic resist pattern line CD in nm. The curve 1388 is based on bivariate linear fit of the X and Y-axis variables data for the process described in relation to FIG. 7A to FIG. 7C.

Figure 9A:
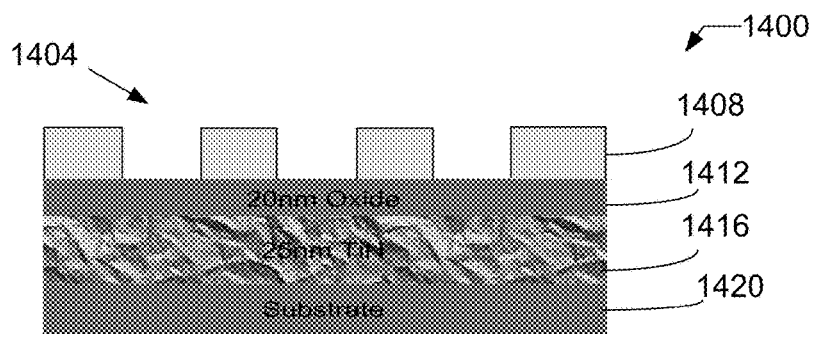
FIG. 9A depicts a schematic of an input substrate with an inorganic resist pattern with an underlying layer comprising an oxide layer, a titanium nitride layer, and a base layer.

FIG. 9A depicts a schematic 1400 of an input substrate 1404 with an inorganic resist pattern 1408 and an underlying layer comprising an oxide layer 1412, a titanium nitride layer 1416, and a base layer 1420.

Figure 9B:
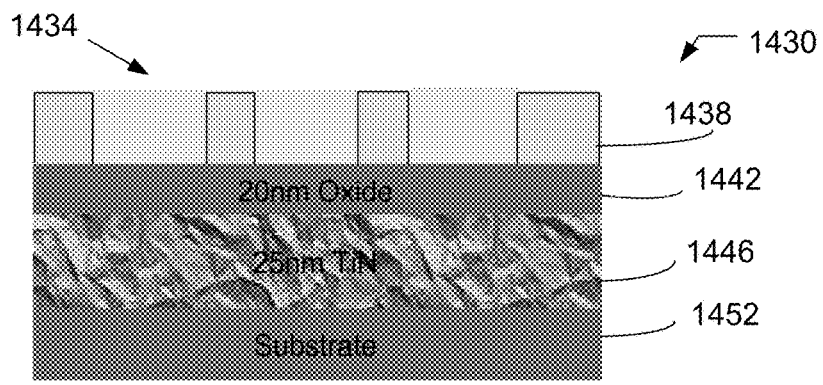
FIG. 9B depicts a schematic of the substrate after a trimming process of the resist pattern.

FIG. 9B depicts a schematic 1430 of the substrate 1434 after a trimming process of the inorganic resist pattern 1438. Highlighted are the inorganic resist pattern 1438 and the underlying layer comprising an oxide layer 1442, a titanium nitride layer 1446, and a base layer 1452.

Figure 9C:
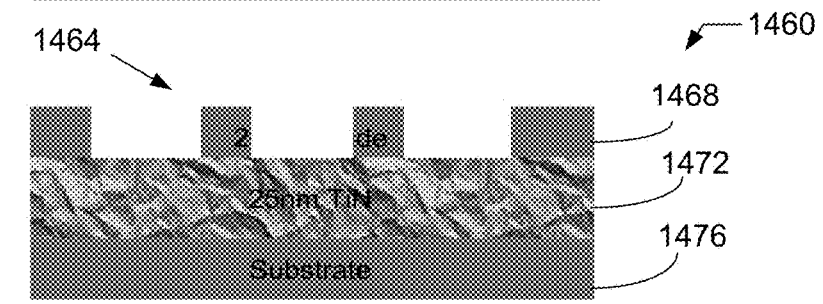
FIG. 9C depicts a schematic of the pattern after a nitride etch process.

FIG. 9C depicts a schematic 1460 of a substrate 1464 after an oxide etch process in an embodiment of the present invention. Highlighted are the oxide pattern 1468 and the underlying layer comprising a titanium nitride layer 1472, and a base layer 1476.

Figure 9D:
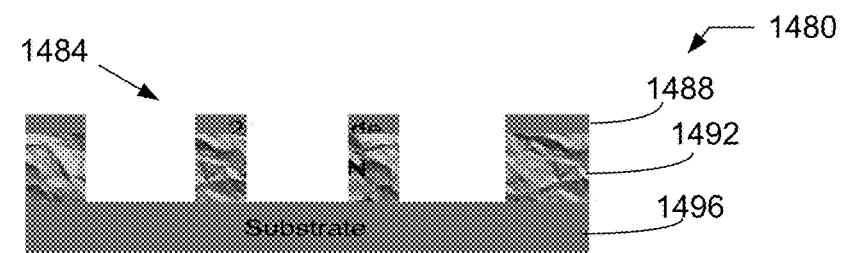
FIG. 9D depicts the substrate after a titanium nitride etch process in an embodiment of the present invention.

FIG. 9D depicts a schematic 1480 of the substrate 1484 after the titanium nitride etch process in an embodiment of the present invention. Highlighted are the pattern comprising an oxide layer 1488 and a titanium nitride layer 1492 and the underlying layer comprising a base layer 1496.

Figure 10A:
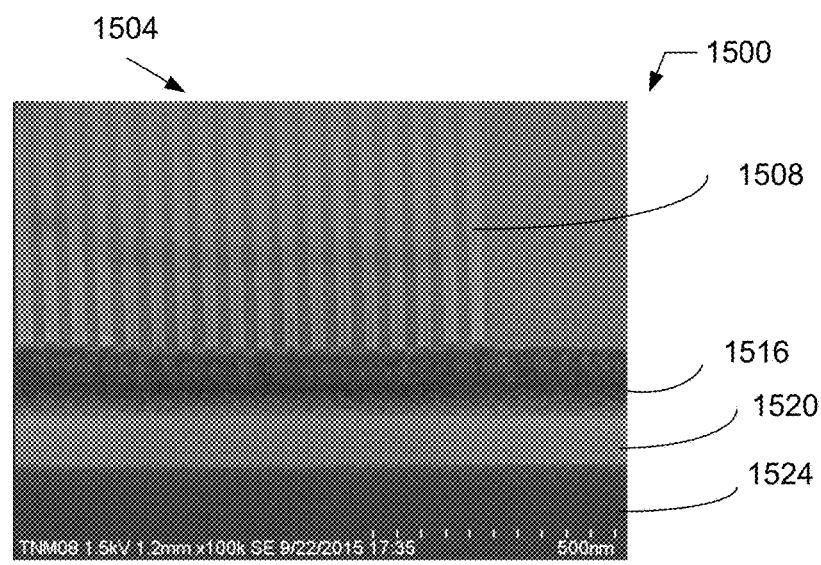

FIG. 10A depicts a slanted-view 1500 of the input inorganic resist pattern 1508 comprising $SnO_x$ in a substrate 1504. Also depicted is an underlying layer comprising an oxide layer 1516, a titanium nitride layer 1520, and a base layer 1524.

Figure 10B:
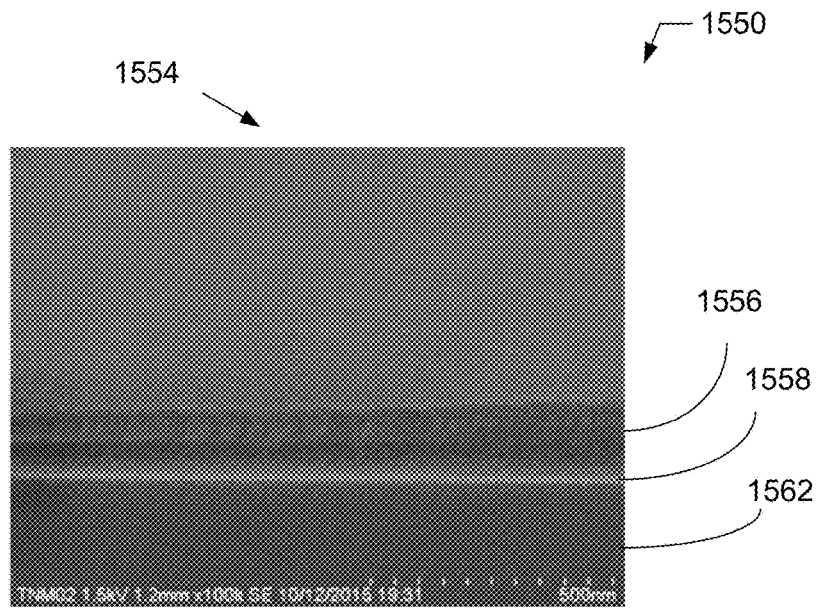
FIG. 10B is a slanted-view of the substrate after using a strip etch, highlighting no damage to the oxide film underneath in an embodiment of the present invention.

FIG. 10B is a slanted-view 1550 of the substrate 1554 after using a strip etch removing the $SnO_x$ resist pattern, highlighting no damage to the oxide layer 1556 underneath, the titanium nitride layer 1558, and the base layer 1562. As mentioned above, the oxide layer 1516 can be silicon oxide, thermal oxide, chemical vapor deposition (CVD) oxide, tetra-ethyl-ortho-silane (TEOL), and the like. The base layer 1562 can comprise amorphous silicon, silicon, titanium nitride, tungsten, tungsten silicon, silicon oxide, silicon nitride, polysilicon, p-doped silicon, n-doped silicon, carbon and the like.

Figure 11:
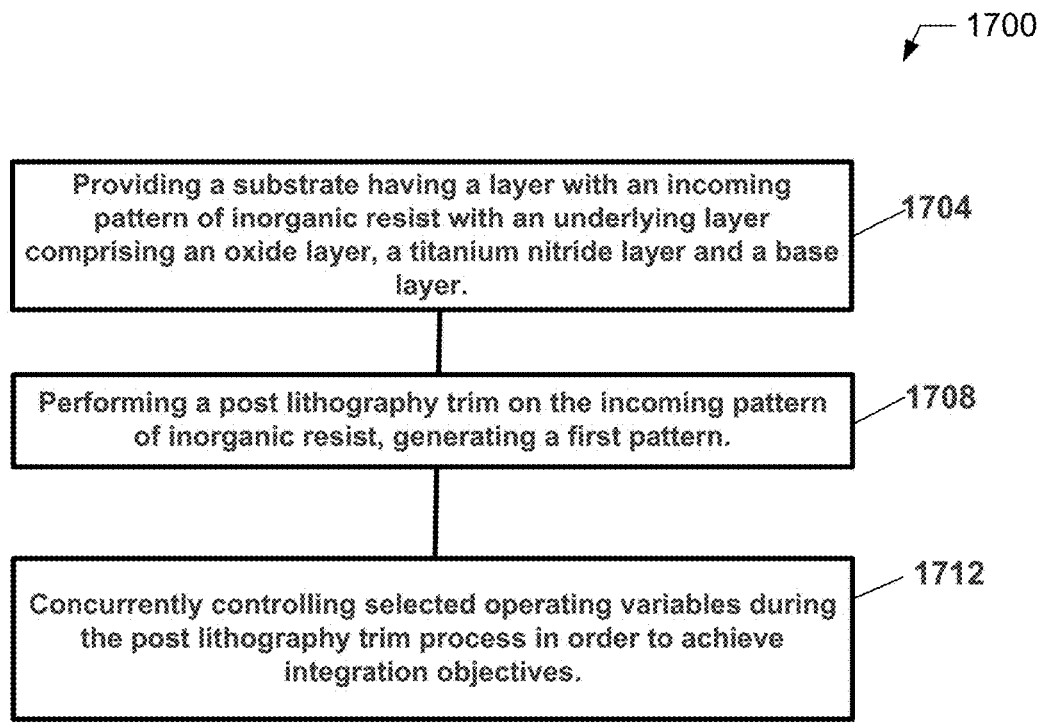
FIG. 11 is an exemplary process flow chart for a method of performing an inorganic resist trim in an integration scheme using an etch system.

FIG. 11 is an exemplary process flow chart 1700 for a method of performing a post lithography trim process on an incoming inorganic resist. The inorganic resist can be an $SnO_x$ compound where x is a positive number. The $SnO_x$ compound can be SnO or $SnO_2$. Other inorganic resists can also be used. In operation 1704, a substrate having a layer with an incoming pattern of inorganic resist with an underlying layer comprising an oxide layer, a titanium nitride layer and a base layer is provided in a process chamber of an etch system. As mentioned above, the oxide layer can be silicon oxide, thermal oxide, chemical vapor deposition (CVD) oxide, tetra-ethyl-ortho-silane (TEOL), and the like. The base layer can comprise amorphous silicon, silicon, titanium nitride, tungsten, tungsten silicon, silicon oxide, silicon nitride, polysilicon, p-doped silicon, n-doped silicon, carbon and the like.

In operation 1708, a post lithography trim on the incoming pattern of inorganic resist is performed, generating a first pattern. Trimming is performed by exposing the substrate to an etchant gas mixture comprising $CH_3F$. A diluent gas such as argon is added to the etchant gas mixture. $BCl_3$ can also be used instead of $CH_3F$ and another noble gas can be used instead of argon. In operation 1712, selected operating variables during the post lithography trim process are concurrently controlled in order to achieve integration objectives.

The trimming can be done with a process chamber temperature of 10 to 80 degrees C., a chamber pressure of 20 to 50 mT, and an electrostatic chuck (ESC) temperature of 40 to 60 degrees C., and the trim process time can be in a range from 2 to 10 seconds. The flow rate of the $CH_3F$ can be 20 to 35 sccm and the flow rate of the argon can be 1200 to 1700 sccm. The high frequency power source can be 60 to 80 mHz and produce 90 to 500 W whereas the low frequency power can be 11-15 mHz and produce 90 to 180 W.

The operating variables can include chamber pressure, process chamber temperature, electrostatic chuck temperature, low frequency power, high frequency power, and trim process time. Integration objectives can include target CD, LER, LWR, and substrate throughput. The CD objective can be in a range from 15 to 35 nm, the LER objective can be in a range from 0 to 2.0 nm, and the LWR objective can be in a range from 0 to 2.0 nm.

Figure 12:
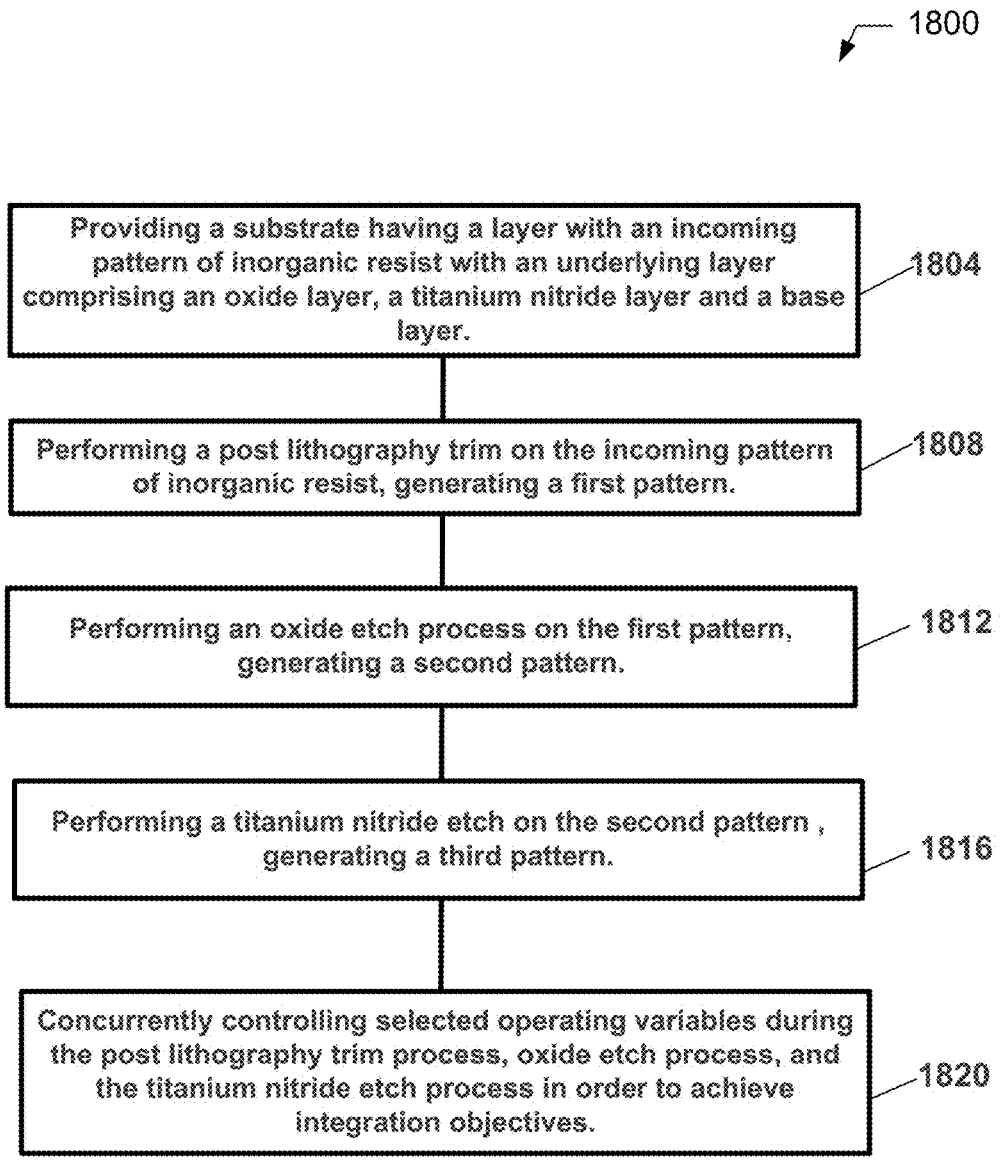
FIG. 12 is another exemplary process flow chart for a method of performing an inorganic resist trim in an integration scheme using an etch system.

FIG. 12 is an exemplary process flow chart 1800 for a method of performing a post lithography trim process on an incoming inorganic resist. In operation 1804, a substrate having a layer with an incoming pattern of inorganic resist with an underlying layer comprising an oxide layer, a titanium nitrate layer and a base layer.

In operation 1808, a post lithography trim on the incoming pattern of inorganic resist is performed, generating a first pattern. In operation 1812, an oxide etch process on the first pattern is performed, generating a second pattern.

In operation 1816, a titanium nitrate etch on the second pattern is performed, generating a third pattern. In operation 1820 selected operating variables are concurrently controlled during the post lithography trim process, oxide etch process and the titanium nitrate etch process in order to achieve integration objectives.

Figure 13:
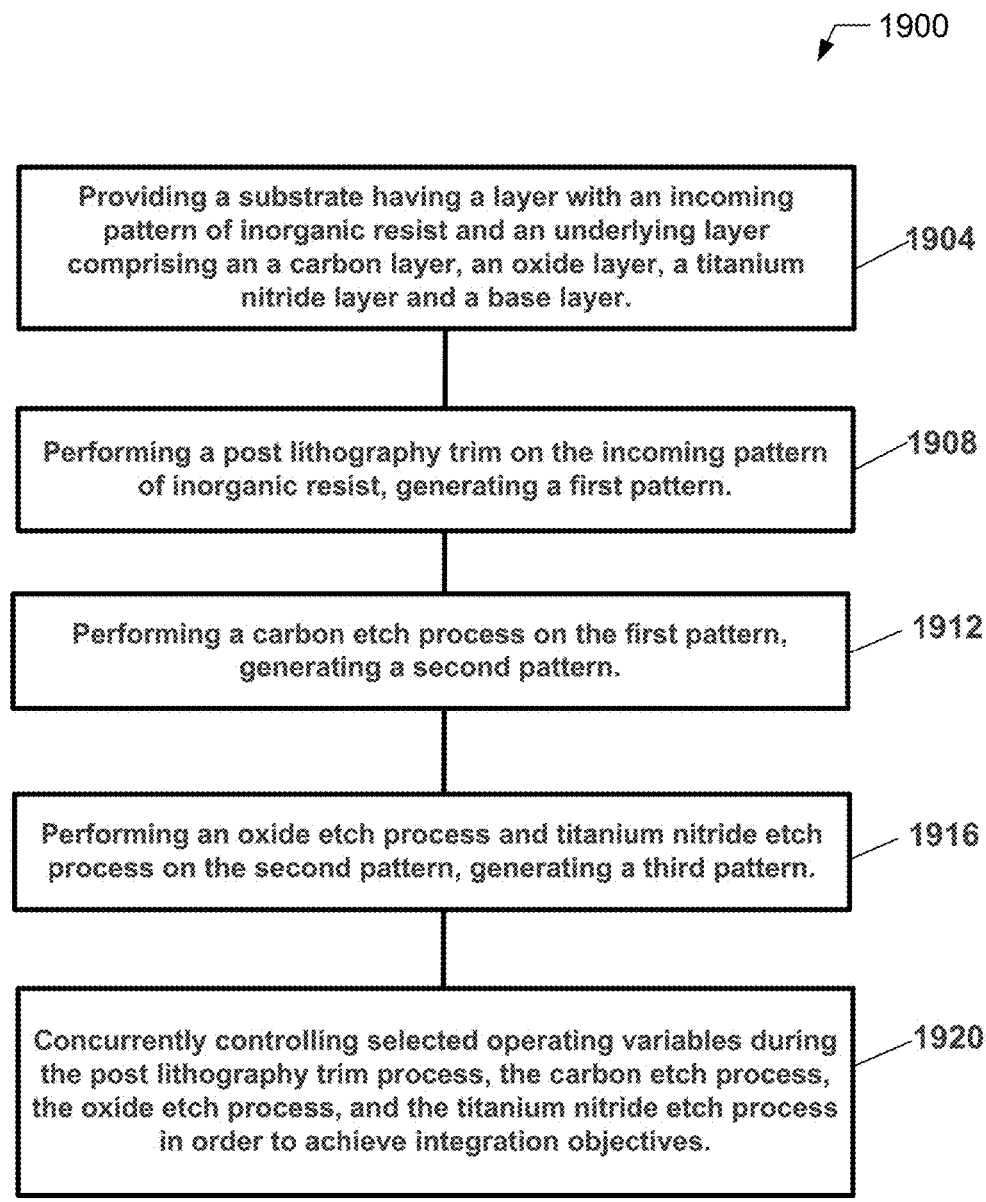
FIG. 13 is still another exemplary process flow chart for a method of performing an integration scheme in another embodiment of the present invention.

FIG. 13 is another exemplary process flow chart 1900 for a method of performing an integration process in another embodiment of the present invention. In operation 1904, a substrate having a layer with an incoming pattern of inorganic resist and an underlying layer comprising a carbon layer, an oxide layer, a titanium nitrate layer and a base layer is disposed in a process chamber of an etch system. In operation 1908, a post lithography trim on the incoming pattern of inorganic resist is performed, generating a first pattern.

The etch processes in the following operations are known to people in the art and shall not be discussed in detail here. In operation 1912, a carbon etch process on the first pattern is performed, generating a second pattern. The carbon etch process can use an etchant gas mixture of $O_2$ at about 40 sccm, $CO_2$ at about 80 sccm, and He at about 200 sccm.

In operation 1916, an oxide etch process and a titanium nitride etch process are performed, generating a third pattern. The oxide etch process can use an etchant gas mixture of $C_4H_8$ at about 30 sccm, $O_2$ at about 15 sccm, and Ar at about 1500 sccm. The titanium etch process can use an etchant gas mixture of $Cl_2$ at about 35 sccm, $CH_4$ at about 15 sccm, and Ar at about 1000 sccm.

In operation 1920, selected operating variables are concurrently controlled during the post lithography trim process, the carbon etch process, the oxide etch process, and the titanium nitrate etch process to achieve integration objectives.

Prior art does not indicate use of flouromethane, $CH_3F$, for trimming inorganic resist. $CH_3F$ is typically not used to perform removal processes such as trimming for tin oxides, $SnO_x$, in an extreme ultra-violet (EUV) resist. The inventors found that $SnO_x$ can be successfully trimmed to meet the integration objectives by tightly controlling selected two or more operating variables of the integration scheme such as etching time, chamber pressure, radio frequency (RF) power, and electrostatic chuck temperature, and other variables. The inventors were able to trim the $SnO_x$ resist from 5 to 25 seconds and transfer the trimmed $SnO_x$ without degradation of transfer fidelity to the oxide layer and continue the pattern into the next layer down without broken lines, without pattern collapse or inability to transfer, in the example discussed above, to a nitride layer. Other combinations of layer materials can also be used as mentioned in the lists above.

Figure 14:
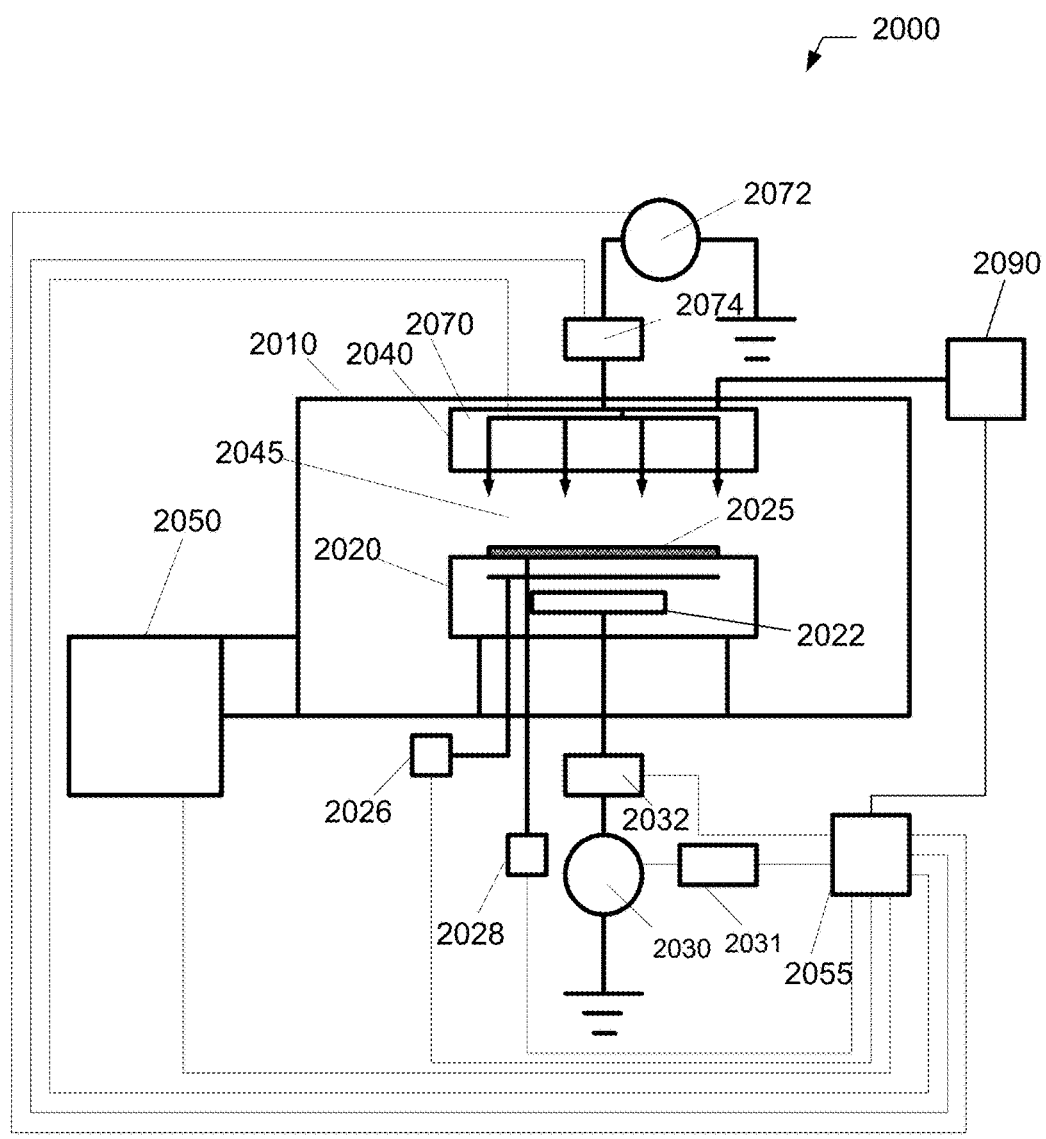
FIG. 14 is an exemplary systems chart including a controller of an integration system in an embodiment of the present invention.

FIG. 14 is an exemplary systems chart 2000 including a controller 2055 of an integration system in an embodiment of the present invention. A plasma etch system 2002 configured to perform the above-identified process conditions is depicted in FIG. 14 comprising a processing chamber 2010, substrate holder 2020, upon which a substrate 2025 to be processed is affixed, and a vacuum pumping system 2050. Substrate 2025 can be a semiconductor substrate, a wafer, a flat panel display, or a liquid crystal display. Processing chamber 2010 can be configured to facilitate etching the processing region 2045 in the vicinity of a surface of substrate 2025. An ionizable gas or mixture of process gases is introduced via a gas distribution system 2040. For a given flow of process gas, the process pressure is adjusted using the vacuum pumping system 2050. The processing can aid the removal of material from the exposed surfaces of substrate 2025. The etch processing system 2000 can be configured to process substrates of any desired size, such as 200 mm substrates, 300 mm substrates, or larger.

Substrate 2025 can be affixed to the substrate holder 2020 via a clamping system 2028, such as a mechanical clamping system or an electrical clamping system (e.g., an electrostatic clamping system). Furthermore, substrate holder 2020 can include a heating system (not shown) or a cooling system (not shown) that is configured to adjust and/or control the temperature of substrate holder 2020 and substrate 2025. The heating system or cooling system may comprise a re-circulating flow of heat transfer fluid that receives heat from substrate holder 2020 and transfers heat to a heat exchanger system (not shown) when cooling, or transfers heat from the heat exchanger system to substrate holder 2020 when heating. In other embodiments, heating/cooling elements, such as resistive heating elements, or thermo-electric heaters/coolers can be included in the substrate holder 2020, as well as the chamber wall of the processing chamber 2010 and any other component within the processing system 2000.

Additionally, a heat transfer gas can be delivered to the backside of substrate 2025 via a backside gas supply system 2026 in order to improve the gas-gap thermal conductance between substrate 825 and substrate holder 2020. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 2025.

In the embodiment shown in FIG. 14, substrate holder 2020 can comprise an upper electrode 2070 and a lower electrode 2022 through which RF power is coupled to the processing region 2045. For example, substrate holder 2020 can be electrically biased at an RF voltage via the transmission of RF power from an RF generator 2030 through an optional impedance match network 2032 to substrate holder 2020. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 80 MHz. RF systems for plasma processing are well known to those skilled in the art.

Furthermore, the electrical bias of electrode 2022 at an RF voltage may be pulsed using a pulsed bias signal controller 2031. The RF power output from the RF generator 2030 may be pulsed between an off-state and an on-state, for example. Alternately, RF power is applied to the substrate holder electrode at multiple frequencies. Furthermore, impedance match network 2032 can improve the transfer of RF power to plasma in plasma processing chamber 2010 by reducing the reflected power. Match network topologies (e.g. L-type, R-type, T-type, etc.) and automatic control methods are well known to those skilled in the art.

Gas distribution system 2040 may comprise a showerhead design for introducing a mixture of process gases. Alternatively, gas distribution system 2040 may comprise a multi-zone showerhead design for introducing a mixture of process gases and adjusting the distribution of the mixture of process gases above substrate 2025. For example, the multi-zone showerhead design may be configured to adjust the process gas flow or composition to a substantially peripheral region above substrate 2025 relative to the amount of process gas flow or composition to a substantially central region above substrate 2025 or split into a center flow and an edge flow.

Vacuum pumping system 2050 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 2010.

As mentioned above, the controller 2055 can comprise a microprocessor, memory, and a digital I/O port capable of generating control voltages sufficient to communicate and activate inputs to processing system 2000 as well as monitor outputs from plasma processing system 2000. Moreover, controller 2055 can be coupled to and can exchange information with RF generator 830, pulsed bias signal controller 2031, impedance match network 2032, the gas distribution system 2040, vacuum pumping system 2050, as well as the substrate heating/cooling system (not shown), the backside gas supply system 2026, and/or the electrostatic clamping system 2028. For example, a program stored in the memory can be utilized to activate the inputs to the aforementioned components of processing system 2000 according to a process recipe in order to perform a plasma assisted process, such as a plasma etch process or a PHT process, on substrate 2025.

In addition, the processing system 2000 can further comprise an upper electrode 2070 to which RF power can be coupled from RF generator 2072 through optional impedance match network 2074. A frequency for the application of RF power to the upper electrode can range from about 0.1 MHz to about 200 MHz. Additionally, a frequency for the application of power to the lower electrode can range from about 0.1 MHz to about 80 MHz. Moreover, controller 2055 is coupled to RF generator 2072 and impedance match network 2074 in order to control the application of RF power to upper electrode 2070. The design and implementation of an upper electrode is well known to those skilled in the art. The upper electrode 2070 and the gas distribution system 2040 can be designed within the same chamber assembly, as shown. Alternatively, upper electrode 2070 may comprise a multi-zone electrode design for adjusting the RF power distribution coupled to plasma above substrate 2025. For example, the upper electrode 2070 may be segmented into a center electrode and an edge electrode.

Depending on the applications, additional devices such as sensors or metrology devices can be coupled to the processing chamber 2010 and to the controller 2055 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of PHT, patterning uniformity (uniformity), pulldown of structures (pulldown), slimming of structures (slimming), aspect ratio of structures (aspect ratio), etch selectivity, line edge roughness (LER), line width roughness (LWR), substrate throughput, cost of ownership, and the like are achieved.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of trimming an inorganic resist in an integration scheme, the method comprising:
    disposing a substrate in a process chamber, the substrate having an inorganic resist layer and an underlying layer comprising an oxide layer, a titanium nitride layer, and a base layer, the inorganic resist layer having an inorganic resist pattern;
    performing an inorganic resist trimming process to selectively remove a portion of the inorganic resist pattern on the substrate, the trimming process using a first etchant gas mixture and generating a first pattern; and
    controlling selected two or more operating variables of the integration scheme in order to achieve target integration objectives;
    wherein the first etchant gas mixture comprises a fluorine-containing gas and a diluent gas; and
    wherein the target integration objectives include a target critical dimension (CD), a target line edge roughness (LER), and a target line width roughness (LWR).

2. The method of claim 1 wherein the inorganic resist layer is $SnO_x$, where x is a non-zero number.

3. The method of claim 2 wherein the $SnO_x$ is SnO or $SnO_2$.

4. The method of claim 3 wherein the first etchant gas mixture includes $CH_3F$ or $BCl_3$ and/or the diluent gas is argon.

5. The method of claim 4 wherein the operating variables include a process chamber pressure, a process chamber temperature, a trim process time, an electrostatic chuck temperature, a low frequency power, and a high frequency power.

6. The method of claim 5 wherein the trim process time is in a range from 2 to 15 seconds, the target CD is in a range from 10 to 35 nm, the LER is in a range from 0 to 2.0 nm, and the LWR is in a range from 0 to 2.0 nm.

7. The method of claim 6 wherein the electrostatic chuck temperature is in a range from 40 to 60 degrees C. and the process chamber temperature is in a range from 10 to 80 degrees C.

8. The method of claim 7 wherein the high frequency power is in a range from 90 to 500 W and the low frequency power is in a range from 90 to 180 W.

9. The method of claim 8 wherein the inorganic resist pattern comprises a line and space pattern and/or a contact hole pattern.

10. The method of claim 9 further comprising:
    after performing the inorganic resist trimming process, performing an oxide etch process using a second etchant gas mixture and generating a second pattern;
    performing a breakthrough etch process using a third etchant gas mixture and generating a third pattern;
    performing a titanium nitride etch process using a fourth etchant gas mixture and generating a last pattern.

11. The method of claim 10 wherein the selected two or more operating variables further comprise an oxide etch process time, a breakthrough etch process time, and a titanium nitride etch process time.

12. The method of claim 11 wherein the third etchant gas mixture comprises $BCl_3$.

13. The method of claim 12 wherein the fourth etchant gas mixture comprises $Cl_2/CH_4/Ar$.

14. The method of claim 13 wherein the inorganic resist trimming process is controlled by modulating the trim process time based on a measured CD of the inorganic resist pattern.

15. The method of claim 13 wherein the inorganic resist trimming process is controlled by modulating the trim process time based on a measured CD of the inorganic resist pattern, the process chamber temperature, and/or the process chamber pressure.

16. The method of claim 13 wherein the inorganic resist trimming process is controlled by modulating the trim process time based on a measured CD of the inorganic resist pattern, the low frequency power, the high frequency power, and/or the electrostatic chuck temperature.

17. A method of trimming an inorganic resist in an integration scheme, the method comprising:
  disposing a substrate in a process chamber, the substrate having an inorganic resist layer and an underlying layer, the underlying layer comprising a carbon layer, an oxide layer, a titanium nitride layer, and a base layer, the inorganic resist layer having an inorganic resist pattern;
  performing an inorganic resist trimming process to selectively remove a portion of the inorganic resist pattern on the substrate, the inorganic resist trimming process using a first etchant gas mixture and generating a first pattern;
  performing an oxide etch process using a second etchant gas mixture and generating a second pattern;
  performing a breakthrough etch process using a third etchant gas mixture and generating a third pattern;
  performing a titanium nitride etch process using a fourth etchant gas mixture and generating a last pattern; and
  controlling selected two or more operating variables of the integration scheme in order to achieve target integration objectives;
  wherein the first etchant gas mixture is a fluorine-containing gas and a diluent gas;
  wherein the target integration objectives include a target critical dimension (CD) a target line edge roughness (LER), and a target line width roughness (LWR); and
  wherein the inorganic resist pattern is a line and space pattern and/or a contact hole pattern.

18. The method of claim 17 wherein the inorganic resist layer includes $SnO_x$ where x is a non-zero number or the $SnO_x$ is SnO or $SnO_2$, the first etchant gas mixture includes $CH_3F$ or $BCl_3$ and the diluent gas is argon, and/or a trim process time is in a range from 2 to 15 seconds, the target CD is in a range from 10 to 35 nm, the LER is in a range from 0 to 2.0 nm, and the LWR is in a range from 0 to 2.0 nm.

19. The method of claim 18 wherein the inorganic resist trimming process is controlled by modulating the trim process time based on the measured CD of the inorganic resist pattern, the low frequency power, the high frequency power, and/or the electrostatic chuck temperature.

20. The method of claim 18 further comprising:
  after performing the inorganic resist trimming process, performing an advanced process film (APF) etch process using an APF etchant gas mixture;
  after performing the titanium nitride etch process, performing an APF strip process using an APF strip etchant gas mixture.

* * * * *

UNITED STATES PATENT AND TRADEMARK OFFICE
CERTIFICATE OF CORRECTION

PATENT NO. : 9,899,219 B2
APPLICATION NO. : 15/232330
DATED : February 20, 2018
INVENTOR(S) : Vinh Luong et al.

Page 1 of 1

It is certified that error appears in the above-identified patent and that said Letters Patent is hereby corrected as shown below:

In the Drawings

In FIG. 13, Box 1904, Line 3, "comprising an a carbon layer," should read --comprising a carbon layer,--.

In the Specification

In Column 4, Line 61, "less 12 nm or less." should read --less to 12 nm or less.--.

In Column 8, Line 61, "titanium nitrate layer and a base layer." should read --titanium nitrate layer and a base layer is disposed in a process chamber.--.

In the Claims

In Column 14, Line 9, Claim 17, "critical dimension (CD) a target" should read --critical dimension (CD), a target--.

Signed and Sealed this
Fifth Day of June, 2018

Andrei Iancu
*Director of the United States Patent and Trademark Office*